(12) United States Patent
Bae

(10) Patent No.: US 10,423,483 B2
(45) Date of Patent: Sep. 24, 2019

(54) SEMICONDUCTOR MEMORY DEVICE AND METHOD FOR CONTROLLING WRITE TIMING OF PARITY DATA

(71) Applicant: SAMSUNG ELECTRONICS CO., LTD., Suwon-si, Gyeonggi-do (KR)

(72) Inventor: Won-Il Bae, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 353 days.

(21) Appl. No.: 15/348,315

(22) Filed: Nov. 10, 2016

(65) Prior Publication Data

US 2017/0147434 A1    May 25, 2017

(30) Foreign Application Priority Data

Nov. 24, 2015 (KR) .................. 10-2015-0164417

(51) Int. Cl.
| | |
|---|---|
| *G06F 11/10* | (2006.01) |
| *G06F 3/06* | (2006.01) |
| *G11C 29/52* | (2006.01) |
| *G11C 29/00* | (2006.01) |
| *G11C 29/04* | (2006.01) |

(52) U.S. Cl.
CPC .......... *G06F 11/1068* (2013.01); *G06F 3/064* (2013.01); *G06F 3/0619* (2013.01); *G06F 3/0679* (2013.01); *G11C 29/52* (2013.01); *G11C 29/70* (2013.01); *G11C 2029/0411* (2013.01)

(58) Field of Classification Search
CPC . G11C 29/52; G11C 29/70; G11C 2029/0411; G06F 3/0619; G06F 3/064; G06F 3/0679; G06F 11/1068
See application file for complete search history.

(56) References Cited

U.S. PATENT DOCUMENTS

| | | |
|---|---|---|
| 4,531,213 A | 7/1985 | Scheuneman |
| 4,864,571 A | 9/1989 | Sakamoto |
| 6,104,648 A * | 8/2000 | Ooishi ................. G11C 7/1006 365/200 |
| 6,957,378 B2 | 10/2005 | Koga et al. |
| 6,977,858 B2 | 12/2005 | Osada et al. |
| 7,200,780 B2 | 4/2007 | Kushida |
| 8,065,589 B2 | 11/2011 | Iida |
| 8,837,241 B2 | 9/2014 | Takahashi |
| 2011/0078538 A1 * | 3/2011 | Ikegawa ............. G11C 11/1675 714/758 |

(Continued)

*Primary Examiner* — Harry W Byrne
*Assistant Examiner* — R Lance Reidlinger
(74) *Attorney, Agent, or Firm* — F. Chau & Associates, LLC

(57) ABSTRACT

A method of operating a semiconductor memory device including a memory cell array and an error correction circuit is provided as follows. A write command, main data and an address are received from a memory controller. An error correction data unit is provided to the error correction circuit. The error correction data unit includes the main data. At least one parity bit is generated based on the error correction data unit. A write operation is performed, in response to the write command, on a target page selected by the address so that the at least one parity bit and the main data are written to the target page and the at least one parity data is written later than the main data to the target page.

18 Claims, 20 Drawing Sheets

(56) References Cited

U.S. PATENT DOCUMENTS

2014/0149827 A1* 5/2014 Kim .................... G06F 11/1064
714/764
2016/0042809 A1* 2/2016 Kim ....................... G11C 29/42
714/719

* cited by examiner

SEMICONDUCTOR MEMORY DEVICE AND METHOD FOR CONTROLLING WRITE TIMING OF PARITY DATA

CROSS-REFERENCE TO RELATED APPLICATION

This application claims priority under 35 USC § 119 to Korean Patent Application No. 10-2015-0164417, filed on Nov. 24, 2015, in the Korean Intellectual Property Office, the disclosure of which is incorporated by reference herein in its entirety.

TECHNICAL FIELD

The present inventive concept relates to semiconductor memory devices and a method of operating the same.

DISCUSSION OF RELATED ART

Semiconductor memory devices may be classified into non-volatile memory devices such as flash memory devices and volatile memory devices such as dynamic random access memories (DRAMs). High speed operation and cost efficiency of DRAMs make it possible for DRAMs to be used for system memories. Due to the continuing shrink in fabrication design rule of DRAMs, bit errors of memory cells in the DRAMs may rapidly increase and yield of the DRAMs may decrease. An on-chip error correction code (ECC) is employed for solving increased bit errors.

SUMMARY

According to an exemplary embodiment of the present inventive concept, a method of operating a semiconductor memory device including a memory cell array and an error correction circuit is provided as follows. A write command, main data and an address are received from a memory controller. An error correction data unit is provided to the error correction circuit. The error correction data unit includes the main data. At least one parity bit is generated based on the error correction data unit. A write operation is performed, in response to the write command, on a target page selected by the address so that the at least one parity bit and the main data are written to the target page and the at least one parity data is written later than the main data to the target page.

According to an exemplary embodiment of the present inventive concept, a semiconductor memory device is provided as follows. A memory cell array includes bank arrays. An input/output (I/O) gating circuit is connected to the memory cell array. A control logic circuit decodes a command from a memory controller to generate control signals. An error correction circuit is connected to the I/O gating circuit and corrects an error correction data unit. The control logic circuit receives the command, a main data and an address from the memory controller, controls the error correction circuit to generate at least one parity bit based on the error correction data unit including the main data and controls the I/O gating circuit to write the at least one parity bit to a target page of the memory cell array later than the main data.

According to an exemplary embodiment of the present inventive concept, a method of operating a semiconductor memory device including a memory cell array and an error correction circuit is provided as follows. Main data and an address are received. At least one parity bit is generated from an error correction data unit including the main data. The main data is written through a first data path to a page of the memory cell array. The at least one parity bit is written through a second data path to the page. The page is selected by the address. The at least one parity bit and the main data are written in parallel to the target page. The at least one parity bit starts to be written a predetermined time after the main data is started to be written.

BRIEF DESCRIPTION OF DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
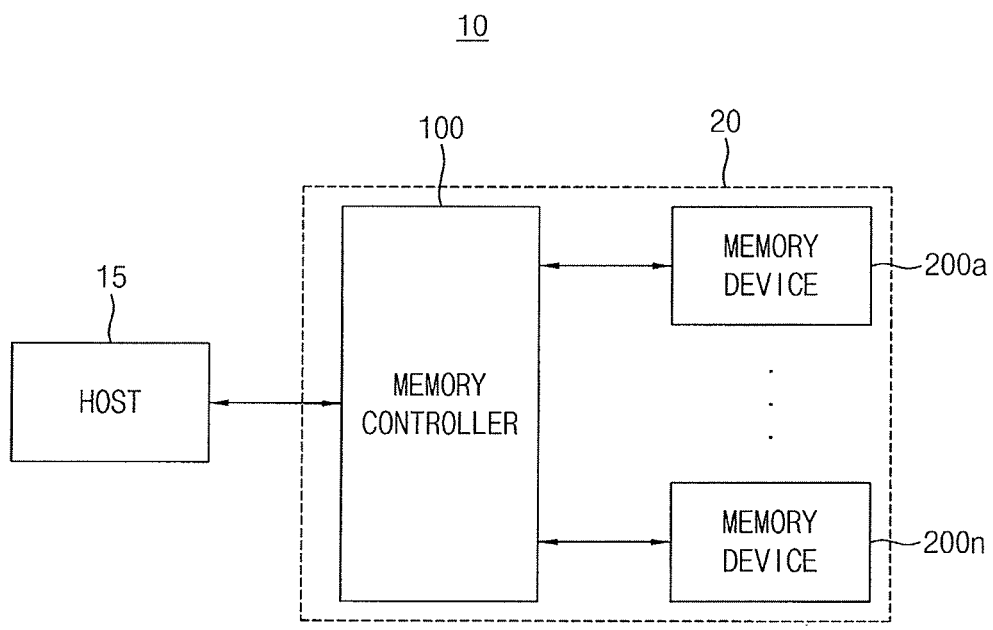
FIG. 1 is a block diagram illustrating an electronic system according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Advancements in semiconductor manufacturing technology have led to an increase in the memory capacity of a semiconductor memory device. As a fabrication process technology has advanced, the number of defective memory cells has increased. 'Fail' memory cells may include defective cells and weak cells. The defective cells are hardware-defective. For example, the defective cells are memory cells that do not operate due to a defect in a manufacturing process, e.g., memory cells in which a disconnection or short of a wiring occurred. The weak cells are software-defective. For example, the weak cells are memory cells that are defective under a specific voltage condition or specific operation timing. Examples of weak cells may include cells that deteriorate in terms of their characteristics, e.g., a cell having a short refresh duration, a cell having a degraded cell write performance or a variable retention time, etc.

To secure the manufacturing yield, 'fail' memory cells are repaired by replacing them with redundant memory cells. For example, 1024 rows of redundant memory cells may be provided.

Other than using the redundancy repair operation, a method of repairing error bits by applying an error correction code (ECC) operation may be used for a dynamic random access memory (DRAM) device or other memory devices.

The ECC operation provides an ECC function of detecting errors, which may occur during writing/reading of data, and correcting the errors. To provide data integrity, the DRAM may employ an ECC circuit. For example, the ECC circuit may perform the ECC operation using parity bits during detection/correction of errors.

FIG. 1 is a block diagram illustrating an electronic system according to example embodiments.

Referring to FIG. 1, an electronic system (or an electronic device) 10 may include a host 15 and a memory system 20. The memory system 20 may include a memory controller 100 and a plurality of semiconductor memory devices 200a~200n (n is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control overall operation of the memory system 20. The memory controller 100 may control overall data exchange between the host 15 and the plurality of semiconductor memory devices 200a~200n. For example, the memory controller 100 may write data to the plurality of semiconductor memory devices 200a~200n or read data from the plurality of semiconductor memory devices 200a~200n in response to request from the host 15.

In addition, the memory controller 100 may issue operation commands to the plurality of semiconductor memory devices 200a~200n for controlling the plurality of semiconductor memory devices 200a~200n.

In an exemplary embodiment, each of the plurality of semiconductor memory devices 200a~200n may be a memory device including resistive type memory cells such as a magnetoresistive random access memory (MRAM), a resistive random access memory (RRAM), a phase change random access memory (PRAM) and a ferroelectric random access memory (FRAM), etc. In an exemplary embodiment, each of the plurality of semiconductor memory devices 200a~200n may be a memory device including dynamic memory cells such as a dynamic random access memory (DRAM).

An MRAM is a nonvolatile computer memory based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charges, an MRAM stores data by using magnetoresistance (or magnetoresistive) elements. In general, a magnetoresistance element is made of two magnetic layers, each being magnetized.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one example embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a fast response time, an MRAM cell has a limited scale and is sensitive to write disturbance because the program current applied to switch the high and low states of the resistance between the magnetic layers of the MRAM is typically high. Accordingly, when a plurality of cells are arranged in an MRAM array, a program current applied to one memory cell changes a magnetic field of a free layer of an adjacent cell. Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated by the spin-polarized electron current passing through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the magnetization direction of the pinned layer and the resistance state of the MTJ is changed.

The STT-MRAM may switch the magnetization direction of the free layer using the spin-polarized electron current without using an external magnetic field. In addition, the STT-MRAM may scale down the cell size and the program current of the STT-RAM is reduced to mitigate (or alternatively, prevent) the write disturbance. In addition, the STT-MRAM may have a high tunnel magnetoresistance ratio for an increased speed of a read operation in a magnetic domain by allowing a high ratio between the high and low states.

An MRAM is an all-round memory device that is fabricated at a low cost and has high capacity (like a dynamic random access memory (DRAM), operates at high speed (like a static random access memory (SRAM), and is nonvolatile (like a flash memory).

Figure 2:
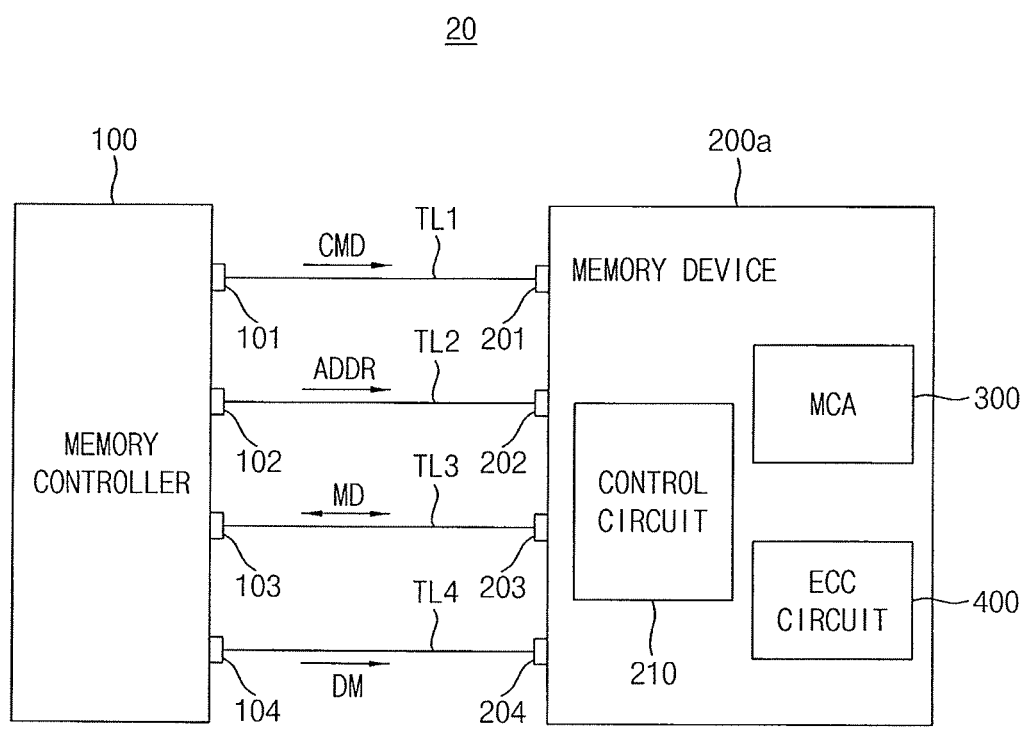
FIG. 2 is a block diagram illustrating the memory system shown in FIG. 1.

FIG. 2 is a block diagram illustrating the memory system shown in FIG. 1.

In FIG. 2, only one semiconductor memory device 200a in communication with the memory controller 100 is illustrated for convenience. However, the details discussed herein related to semiconductor memory device 200a may equally apply to the other semiconductor memory devices 200b-200n.

Referring to FIG. 2, the memory system 20 may include the memory controller 100 and the semiconductor memory device 200a. Each of the memory controller 100 and the semiconductor memory device 200a may be formed as a separate semiconductor chip or as a separate group of chips (e.g., the memory controller 100 and the semiconductor memory device 200a may be packaged together in stacking form of the semiconductor chips).

The memory controller 100 and the semiconductor memory device 200a may be connected to each other through corresponding command pins 101 and 201, corresponding address pins 102 and 202, corresponding data pins 103 and 203 and corresponding separate pins 104 and 204. The command pins 101 and 201 may transmit a command signal CMD through a command transmission line TL1, the address pins 102 and 202 may transmit an address signal ADDR through an address transmission line TL2, and the data pins 103 and 203 may exchange main data MD through a data transmission line TL3. The separate pins 104 and 204 may transmit a data mask signal DM through a transmission line TL4. The semiconductor memory device 200a may perform a masked write operation in response to the data mask signal DM. In example embodiments, the separate pins 104 and 204 and the transmission line TL4 need not be included in the memory system 20.

The semiconductor memory device 200a may include a memory cell array 300 that stores the main data MD, an error correction circuit 400 and a control logic circuit 210 (also referred to as a 'control logic') that controls the error correction circuit 400.

When the command signal CMD corresponds to a write command, the semiconductor memory device 200a may generate parity data based on at least the main data MD, and may differentiate a write timing of the main data MD and a write timing of the parity data. The semiconductor memory device 200a may start to write the parity data to a second region of a target page designated by the address ADDR after the semiconductor memory device 200a may start to write the main data MD to a first region of the target page. For example, the writing of the parity data and the writing of the main data MD may be performed in parallel, and the writing of the parity data may start to be performed after the writing of the main data MD may start to be performed. When the semiconductor memory device 200a differentiate the write timing of the main data MD and the write timing of the parity data, the semiconductor memory device 200a may prevent an increase of a core cycle time due to the semiconductor memory device 200a employing the error correction circuit 400.

Figure 3:
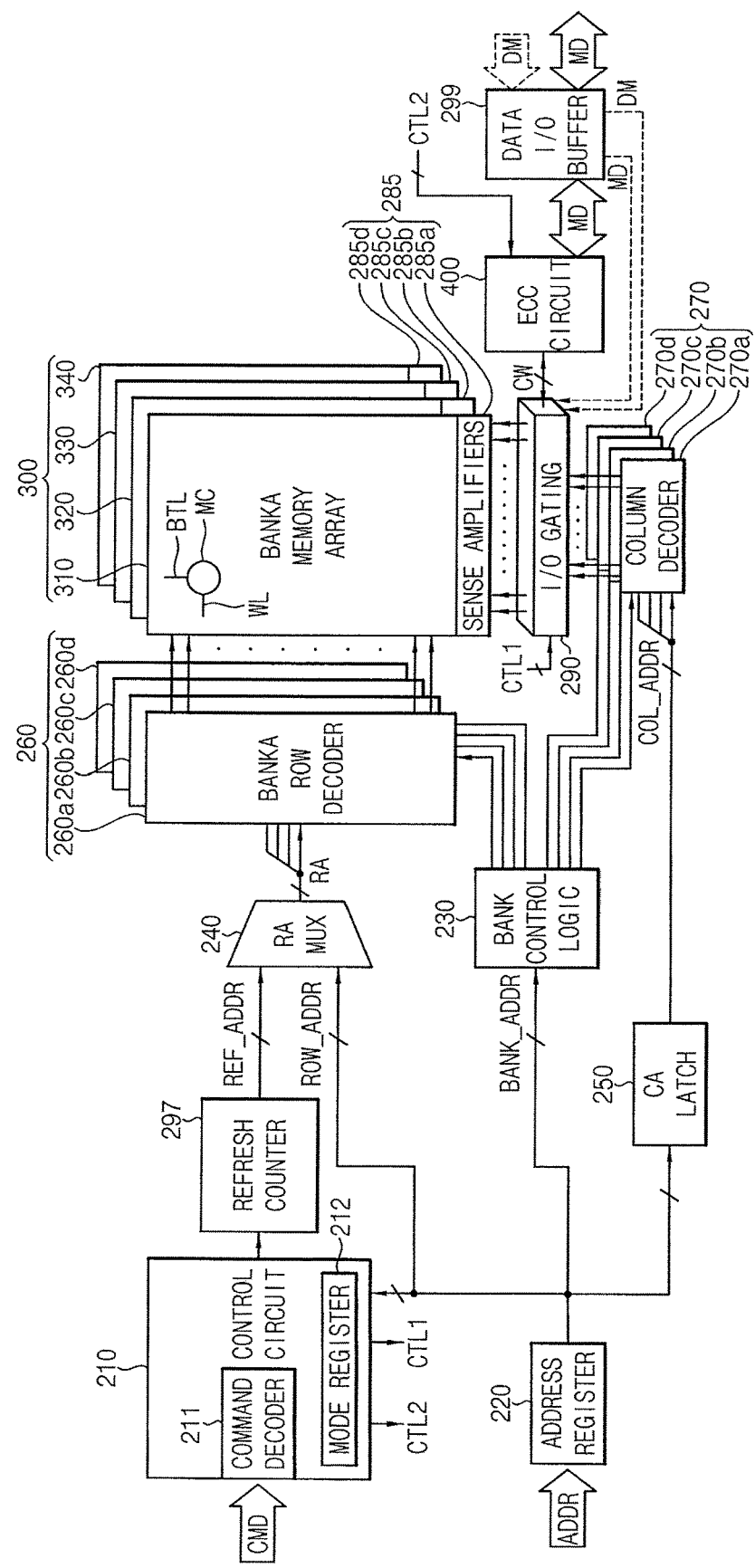
FIG. 3 is a block diagram illustrating the semiconductor memory device shown in FIG. 2, according to an exemplary embodiment of the present inventive concept.

FIG. 3 is a block diagram illustrating the semiconductor memory device shown in FIG. 2, according to example embodiments.

Referring to FIG. 3, the semiconductor memory device 200a may include the control logic circuit 210, an address register 220, a bank control logic 230, a refresh counter 297, a row address multiplexer 240, a column address latch 250, a row decoder 260, a column decoder 270, the memory cell array 300, a sense amplifier unit 285, an input/output (I/O) gating circuit 290, the error correction circuit 400, and a data input/output (I/O) buffer 299.

In an exemplary embodiment, the refresh counter 297 need not be included in the semiconductor memory device 200a. For example, when the memory cell array 300 is implemented with a plurality of resistive type memory cells, the refresh counter 297 need not be included in the semiconductor memory device 200a.

The memory cell array 300 may include first through fourth bank arrays 310~340. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier unit 285 may include first through fourth bank sense amplifiers 285a~280d respectively coupled to the first through fourth bank arrays 310~340. Each of the first through fourth bank arrays 310~340 may include a plurality of memory cells MC, and each of memory cells MC is coupled to a corresponding word line WL and a corresponding bit line BTL. The first through fourth bank arrays 310~340, the first through fourth bank row decoders 260a~260d, the first through fourth bank column decoders 270a~270d and first through fourth bank sense amplifiers 285a~280d may form first through fourth banks. Although the semiconductor memory device 200a shown in FIG. 3 illustrates four banks, the semiconductor memory device 200a may include more or less than four banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 may generate a refresh row address REF_ADDR for refreshing memory cell rows in the memory cell array 300 under control of the control logic circuit 210. The refresh counter 297 may be included when the memory cells MC are implemented with volatile memory cells. For example, the volatile memory cells include a dynamic random access (DRAM) cells.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d may decode the row address RA that is output from the row address multiplexer 240, and may activate a word line corresponding to the row address RA. For example, the activated bank row decoder may apply a word line driving voltage to the word line corresponding to the row address RA.

The column address latch 250 may receive the column address COL_ADDR from the address register 220, and may temporarily store the received column address COL_ADDR. In an exemplary embodiment, in a burst mode, the column address latch 250 may generate column addresses that increment from the received column address COL_ADDR. The column address latch 250 may apply the temporarily stored or generated column address to the first through fourth bank column decoders 270a~270d.

The activated one of the first through fourth bank column decoders 270a~270d may decode the column address COL_ADDR that is output from the column address latch 250, and may control the I/O gating circuit 290 to output data corresponding to the column address COL_ADDR.

The I/O gating circuit 290 may include a circuitry for gating input/output data. The I/O gating circuit 290 may further include an input data mask logic, read data latches for storing data that is output from the first through fourth bank arrays 310~340, and write drivers for writing data to the first through fourth bank arrays 310~340.

Data read from one bank array of the first through fourth bank arrays 310~340 may be sensed by sense amplifiers coupled to the one bank array from which the data is to be read, and may be stored in the read data latches. Main data MD to be written in one bank array of the first through fourth bank arrays 310~340 may be provided to the data I/O buffer 299 from the memory controller 100. The data I/O buffer 299 may provide the main data MD simultaneously to the error correction circuit 400 and the I/O gating circuit 290. The I/O gating circuit 290 may write the main data MD to the target page and write the parity data, generated in the error correction circuit 400 based in the main data MD, to the target page later than the main data.

The data I/O buffer 299 may provide the main data MD from the memory controller 100 simultaneously to the error correction circuit 400 and the I/O gating circuit in a write operation and may provide the main data MD from the error correction circuit 400 to the memory controller 100 in a read operation.

The error correction circuit 400, in a write operation, may generate the parity data based on the main data MD from the data I/O buffer 299 and the I/O gating circuit 290 may write the main data MD to the target page and write the parity data to the target page later than the main data.

In addition, the error correction circuit 400, in a read operation, may receive a codeword CW, read from one bank array, from the I/O gating circuit 290. The error correction circuit 400 may perform an ECC decoding on the main data MD based on the parity data in the codeword CW, may correct a single bit error in the main data MD and may provide corrected main data to the data I/O buffer 299. The present inventive concept is not limited thereto. For example, two or more bit errors of the main data MD may be corrected using the error correction circuit 400.

The control logic circuit 210 may control operations of the semiconductor memory device 200a. For example, the control logic circuit 210 may generate control signals for the semiconductor memory device 200a to perform a write operation or a read operation. The control logic circuit 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a first control signal CTL1 to control the I/O gating circuit 290 and a second control signal CTL2 to control the error correction circuit 400.

FIGS. 4A to 4E are circuit diagrams of examples of the memory cell shown in FIG. 3, according to example embodiments.

Figure 4A:
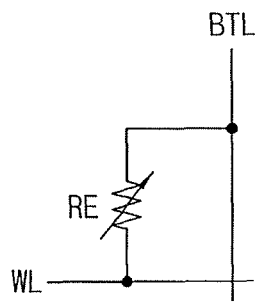
FIGS. 4A to 4E are circuit diagrams of examples of the memory cell shown in FIG. 3, according to an exemplary embodiment of the present inventive concept.
Figure 4B:
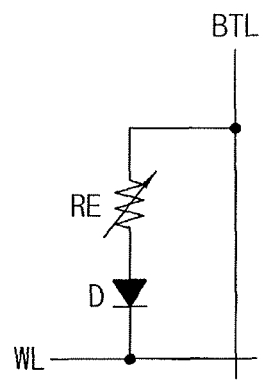
Figure 4C:
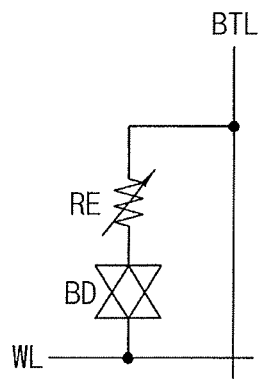
Figure 4D:
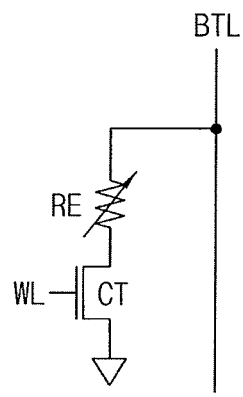
Figure 4E:
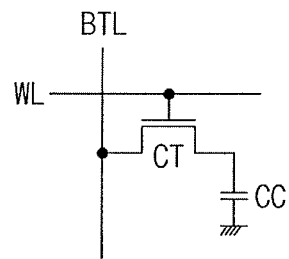

FIGS. 4A to 4D illustrate memory cells MC which are implemented with resistive type memory cells and FIG. 4E illustrates a memory cell MC which is implemented with a volatile memory cell such as a DRAM cell.

FIG. 4A illustrates a resistive type memory cell without a selection element, while FIGS. 4B to 4D show resistive type memory cells each comprising a selection element.

Referring to FIG. 4A, a memory cell MC may include a resistive element RE connected to a bit line BTL and a word line WL. Such a resistive memory cell having a structure without a selection element may store data by a voltage applied between bit line BL and word line WL.

Referring to FIG. 4B, a memory cell MC may include a resistive element RE and a diode D. The resistive element RE may include a resistive material for data storage. The diode D may be a selection element (or switching element) that supplies current to resistive element RE or cuts off the current supply to resistive element RE according to a voltage difference between a word line WL and a bit line BTL. The diode D may be coupled between the resistive element RE and word line WL, and the resistive element RE may be coupled between the bit line BTL and the diode D. Positions of the diode D and the resistive element RE may be interchangeable. The diode D may be turned on or turned off by a voltage difference between a word line voltage and a bit line voltage. Thus, a resistive memory cell may be not driven where a voltage of a constant level or higher is supplied to an unselected word line WL.

Referring to FIG. 4C, a memory cell MC may include a resistive element RE and a bidirectional diode BD. The resistive element R may include a resistive material for data storage. The bidirectional diode BD may be coupled between the resistive element RE and a word line WL, and the resistive element RE may be coupled between a bit line BTL and bidirectional diode BD. Positions of the bidirectional diode BD and the resistive element RE may be interchangeable. The bidirectional diode BD may block leakage current flowing to an unselected semiconductor memory cell.

Referring to FIG. 4D, a memory cell MC may include a resistive element RE and a transistor CT. The transistor CT may be a selection element (or switching element) that supplies current to the resistive element RE or cuts off the current supply to the resistive element RE according to a voltage difference between a word line WL and a bit line BLT. The transistor CT may be coupled between the resistive element RE and a word line WL, and the resistive element RE may be coupled between a bit line BTL and the transistor CT. Positions of the transistor CT and the resistive element RE may be interchangeable. The semiconductor memory cell may be selected or unselected depending on whether the transistor CT driven by word line WL is turned on or turned off.

Referring to FIG. 4E, a memory cell MC may include a cell capacitor CC and a transistor CT. The transistor CT may be a selection element (or switching element) that connects/disconnects the cell capacitor CC to/from bit line BTL according to a voltage of a word line WL. The transistor CT may be coupled between the cell capacitor CC, a word line WL and a bit line BTL, and the cell capacitor CC may be coupled between the transistor CT and a plate voltage source (not illustrated). In an exemplary embodiment, the plate voltage source may provide a ground voltage or a predetermined voltage greater than the ground voltage.

Figure 5:
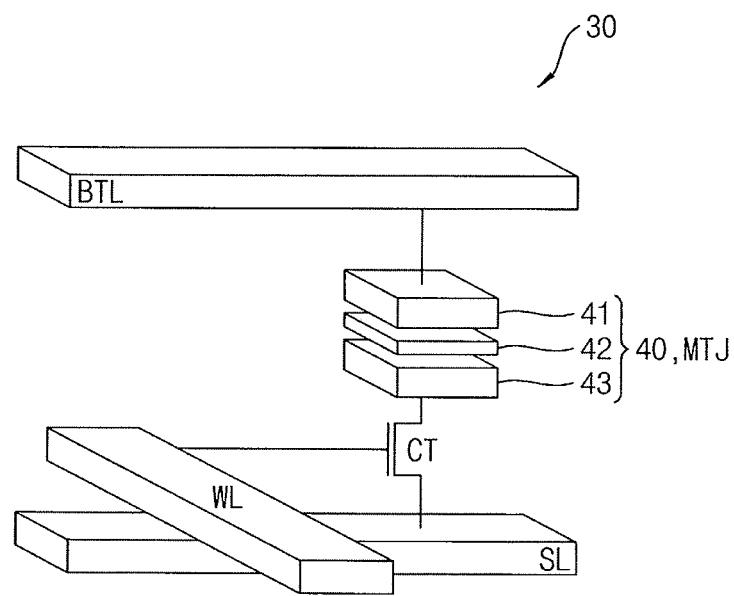
FIG. 5 illustrates an example of the memory cell (referred to as STT-MRAM cell) shown in FIG. 3, according to an exemplary embodiment of the present inventive concept.

FIG. 5 illustrates an example of the memory cell (referred to as STT-MRAM cell) shown in FIG. 3, according to example embodiments.

Referring to FIG. 5, an STT-MRAM cell 30 may include a MTJ element 40 and a cell transistor CT. A gate of the cell transistor CT is connected to a word line WL and one electrode of the cell transistor CT is connected through the MTJ 40 to a bit line BTL. Also, the other electrode of the cell transistor CT is connected to a source line SL.

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. To fix the magnetization direction of the pinned layer 43, for example, an anti-ferromagnetic layer (not shown) may be further provided.

To perform a write operation of the STT-MRAM cell 30, a logic high voltage is applied to the word line WL to turn on the cell transistor CT. A program current, for example, a write current is applied to the bit line BL and the source line SL. A direction of the write current is determined by a logic state of the MTJ element 40.

To perform a read operation of the STT-MRAM cell 30, a logic high voltage is applied to the word line WL to turn on the cell transistor CT, and a read current is supplied to the bit line BL and the source line SL. Accordingly, a voltage is developed at both ends of the MTJ element 40, is detected by the sense amplifier 285a, and is compared with a reference voltage to determine a logic state of the MTJ element 40. Accordingly, data stored in the MTJ element 40 may be detected.

Figure 6A:
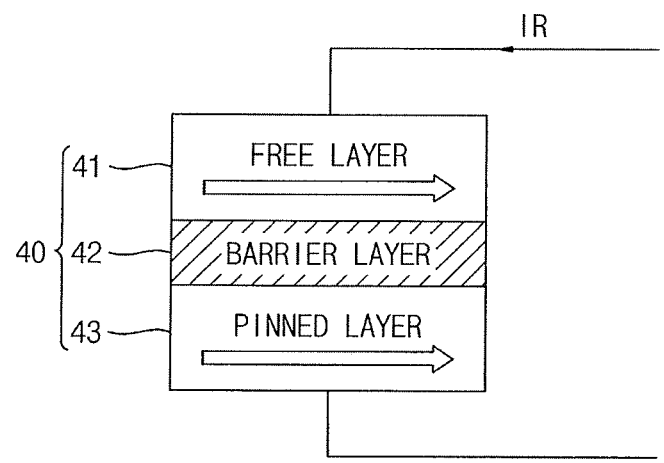
FIGS. 6A and 6B illustrate a magnetization direction according to data written to the MTJ element shown in FIG. 5.
Figure 6B:
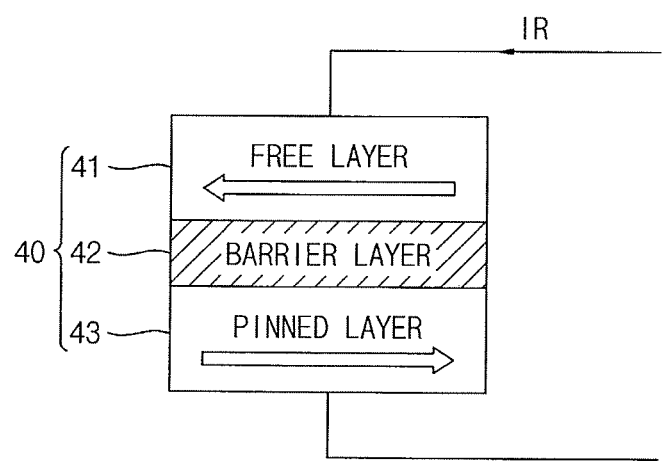

FIGS. 6A and 6B illustrate a magnetization direction according to data written to the MTJ element shown in FIG. 5.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

Referring to FIG. 6A, a magnetization direction of the free layer 41 and a magnetization direction of the pinned layer 43 of the MTJ element 40 are parallel to each other. In this case, the MTJ element 40 may be in a high resistance state and may be read as data '0'.

Referring to FIG. 6B, a magnetization direction of the free layer 41 and a magnetization direction of the pinned layer 43 of the MTJ element 40 are anti-parallel to each other. In this case, the MTJ element 40 may be in a low resistance state, and may be read as data '1'.

Although the free layer 41 and the pinned layer 43 of the MTJ element 40 are horizontal magnetic layers, example embodiments are not limited thereto and the free layer 41 and the pinned layer 43 may be, for example, vertical magnetic layers.

Figure 7:
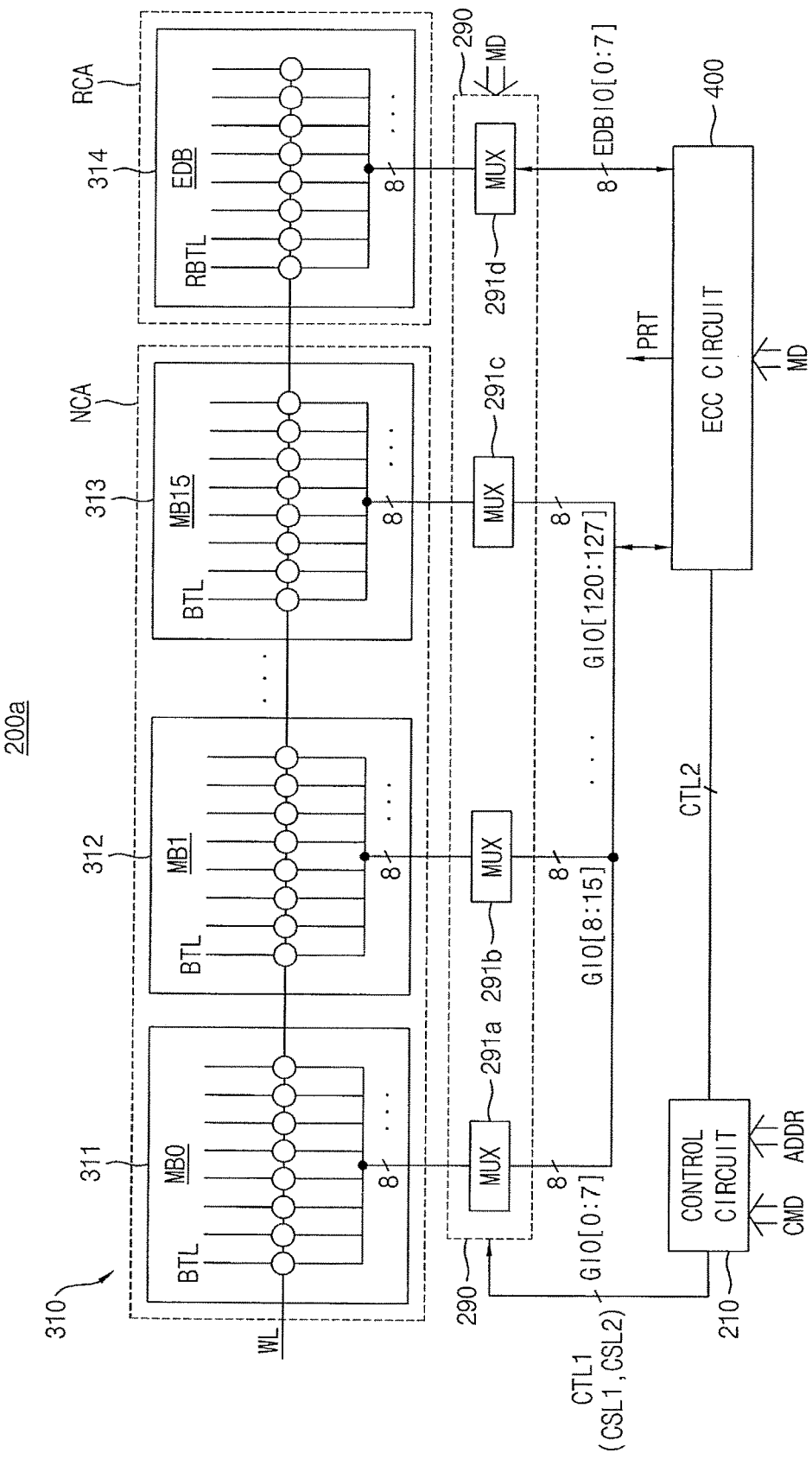
FIG. 7 illustrates a portion of the semiconductor memory device of FIG. 3 in a first normal write mode.
Figure 8:
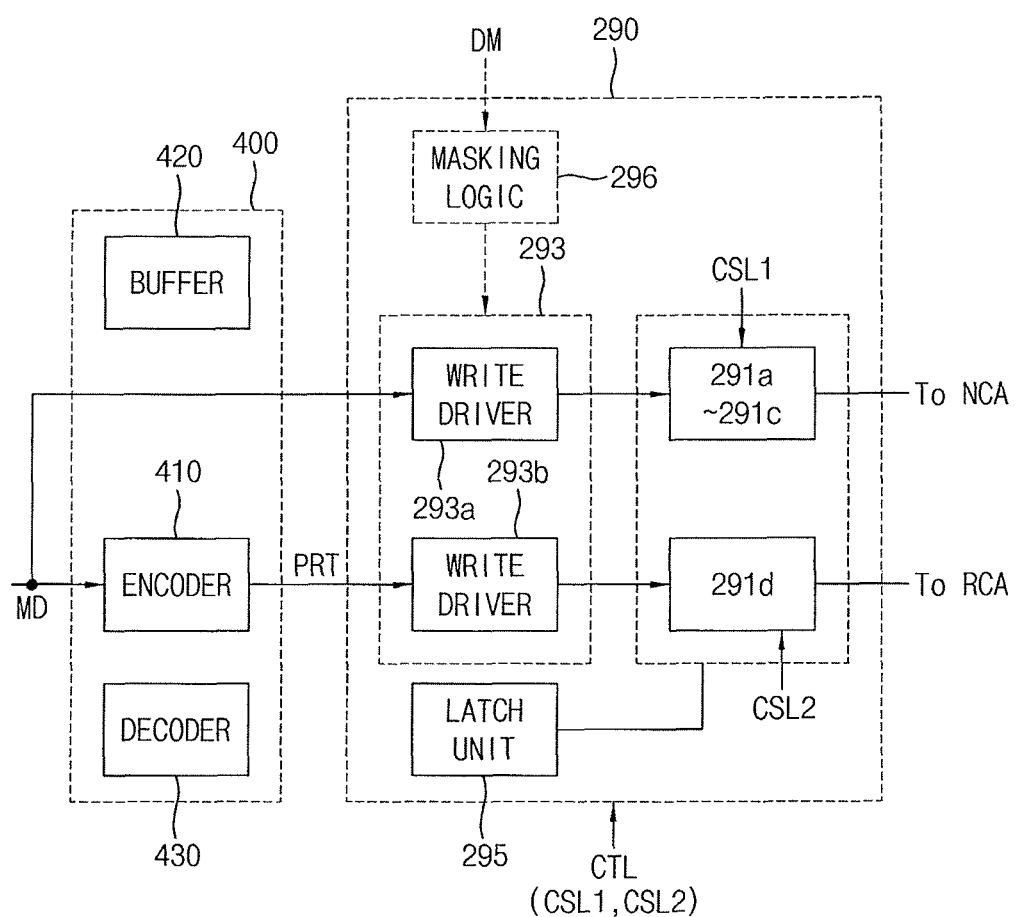
FIG. 8 illustrates the error correction circuit and the I/O gating circuit in FIG. 7.
Figure 9:
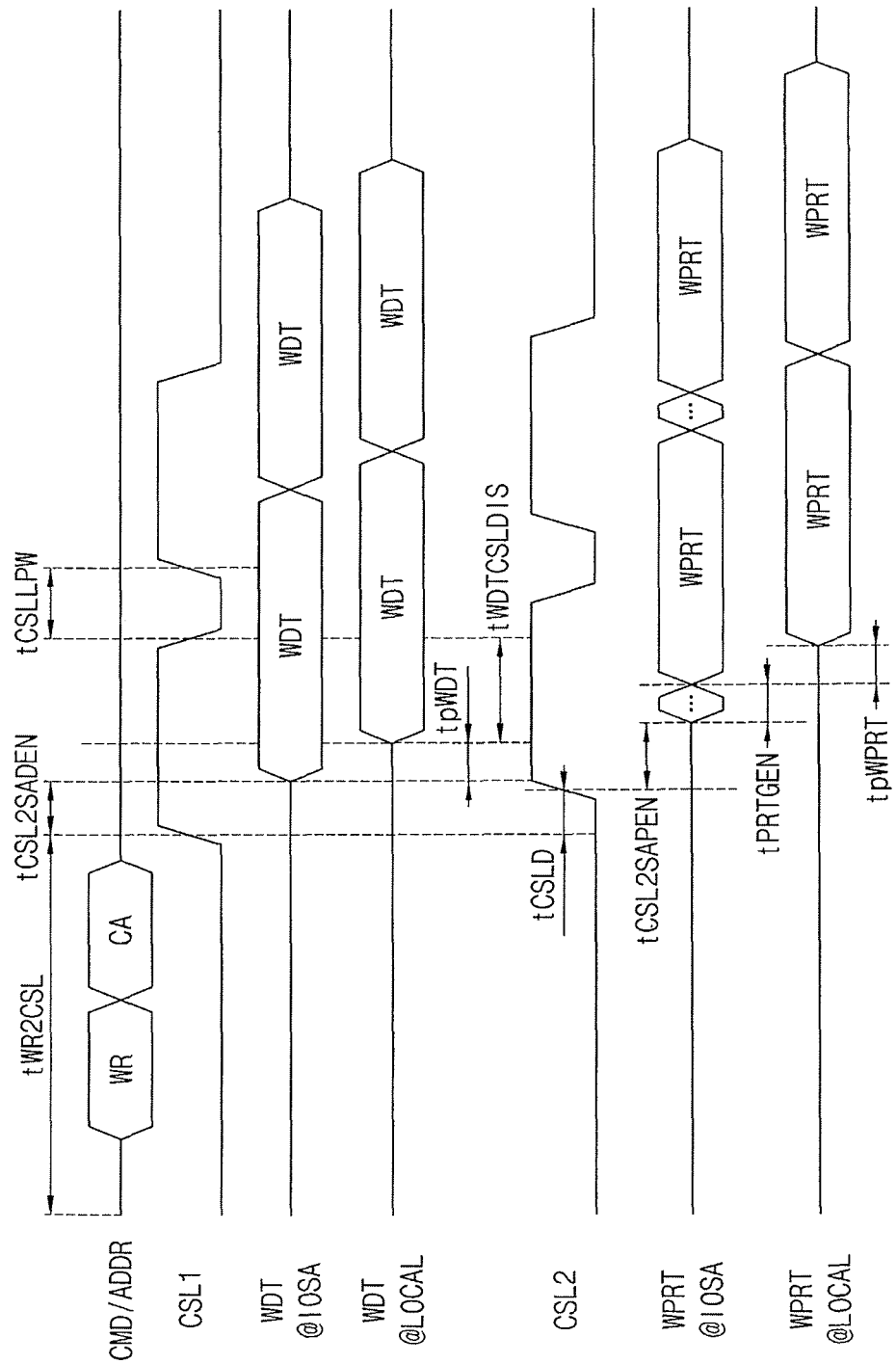
FIG. 9 illustrates an operation timing of the semiconductor memory device of FIG. 7 in the normal write mode according to an exemplary embodiment of the present inventive concept.

FIG. 7 illustrates a portion of the semiconductor memory device of FIG. 3 in a first normal write mode, FIG. 8 illustrates the error correction circuit and the I/O gating circuit in FIG. 7 and FIG. 9 illustrates an operation timing of the semiconductor memory device of FIG. 7 in the first normal write mode.

In FIG. 7, the control logic circuit 210, the first bank array 310, the I/O gating circuit 290, and the error correction circuit 400 are illustrated. FIGS. 7 through 9 illustrate a first write mode when a size of the main data MD is the same as a size of an error correction unit of the error correction circuit 400.

Referring to FIGS. 7 through 9, the first bank array 310 may include a normal cell array NCA and a redundancy cell array RCA. The normal cell array NCA may include a plurality of first memory blocks MB0~MB15, i.e., 311~313, and the redundancy cell array RCA may include at least a second memory block 314. The number of memory cells in first memory blocks 311~313 may determine a memory capacity of the semiconductor memory device 200a. The first memory blocks 311~313 may be referred to a first region and the second memory block 314 may be referred to as a second region.

The second memory block 314 is for ECC and/or redundancy repair. Since the second memory block 314 for ECC and/or redundancy repair is used for ECC, data line repair and block repair to repair 'fail' cells generated in the first memory blocks 311~313, the second memory block 314 is also referred to as an EDB block.

In each of the first memory blocks 311~313, a plurality of first memory cells are arrayed in rows and columns. In the second memory block 314, a plurality of second memory cells are arrayed in rows and columns.

In the first memory blocks 311~313, rows may be formed, for example, of 8192 word lines WL and columns may be formed, for example, of 1024 bit lines BTL. The first memory cells connected to intersections of the word lines WL and the bit lines BTL may be dynamic memory cells or resistive type memory cells. In the second memory block 314, rows may be formed, for example, of 8192 word lines WL and columns may be formed, for example, of 1024 bit lines BTL. The second memory cells connected to intersections of the word lines WL and the bit lines RBTL may be dynamic memory cells or resistive type memory cells.

The error correction circuit 400 may include an ECC encoder 410, an ECC decoder 430 and a buffer 420. The ECC encoder 410 may perform an ECC encoding on the main data MD. The ECC decoder 430 may perform an ECC decoding on the read data.

The I/O gating circuit 290 includes a plurality of switching circuit 291a~291d respectively connected to the first memory blocks 311~313 and the second memory block 314. In the semiconductor memory device 200a, bit lines corresponding to data of a burst length (BL) may be simultaneously accessed to support the BL indicating the maximum number of column positions that is accessible. For example, if the BL is set to 8, data bits may be set to 128 bits. The bit lines BTL may be connected to column selection units connected to 128 column selection signals and 8 bit lines may be simultaneously selected by one column selection unit.

The error correction circuit 400 may be connected to the switching circuits 291a~291d through first data lines GIO [0:127] and second data lines EDBIO[0:7].

The control logic circuit 210 may decode the command CMD and the address ADDR to generate the first control signal CTL1 for controlling the switching circuits 291a~291d and the second control signal CTL2 for controlling the error correction circuit 400. The first control signal CTL1 may include a first column selection signal CSL1 applied to the first switching circuits 291a~291c and a second column selection signal CSL2 applied to the second switching circuit 291d.

Hereinafter, the operation of the semiconductor memory device 200a of FIG. 3 will be described with reference to FIGS. 7 through 9.

The semiconductor memory device 200a receives the command WR directing the write operation and the address CA from the memory controller 100, and the control logic circuit 210 activates the first column selection signal CSL1 first when a time tWR2CSL elapses from a time at which the control logic circuit 210 receives the command CMD. The first write driver 293a and the first switching circuits 291a~291c provide the write data WDT to a sense amplifier when a time tCSL2SADEN elapses from a time at which the first column selection signal CSL1 is activated. The write data WDT is transferred to memory cells in the target page when a time tpWDT elapses from a time at which the write data WDT is transferred to the sense amplifier.

The first column selection signal CSL1 is deactivated when a time tWDTCSLDIS elapses from the time at which the write data WDT is transferred to memory cells in the target page. The first column selection signal CSL1 is activated second when a time tCSLLPW elapses from the time at which the first column selection signal CSL1 is deactivated.

The second column selection signal CSL2 is activated when a time tCSLD elapses from the time at which the first column selection CSL1 is activated. The encoder 410 generates the parity data WPRT during a time tPRTGEN when a time tCSL2SAPEN elapses from the time at which the second column selection signal CSL2 is activated first. The parity data WPRT is transferred to the sense amplifier through the second write driver 293b and the second switching circuit 291d when a time tpWPRT elapses from the timing at which the parity data WPRT is generated.

The parity data WPRT is transferred to memory cells in the second region of the target page when a time tpWPRT elapses from a time at which the parity data WPRT is transferred to the sense amplifier. The second column selection signal CSL2 is deactivated when a time tWDTCSLDIS elapses from the time at which the write parity WPRT is transferred to the second region of the target page.

In the first write mode, the data I/O buffer 299 provides the write data WDT simultaneously to the error correction circuit 400 and the I/O gating circuit 290. The I/O gating circuit 290 writes the write data WDT to the first region of the target page connected to the word line WL through the first switching circuits 291a~291c. The error correction circuit 400 performs an ECC encoding the write data WDT to generate parity data WPRT and provides the parity data WPRT to the I/O gating circuit 290. The control logic circuit 210 activates the second column selection signal CSL2 later than the first column selection signal CSL1 and the I/O gating circuit 290 writes the parity data WPRT to the second memory region 314 of the target page through the second switching circuit 291d later than the write data WDT.

When the parity data WPRT is written in the second memory region 314 of the target page later than the write data WDT, the semiconductor memory device 200a may hide a time required for generating the parity data WPRT to an outside of the semiconductor memory device 200a and may secure an enough interval tCSLLPW between consecutive activation intervals of the first column selection signal CSL1.

Figure 10:
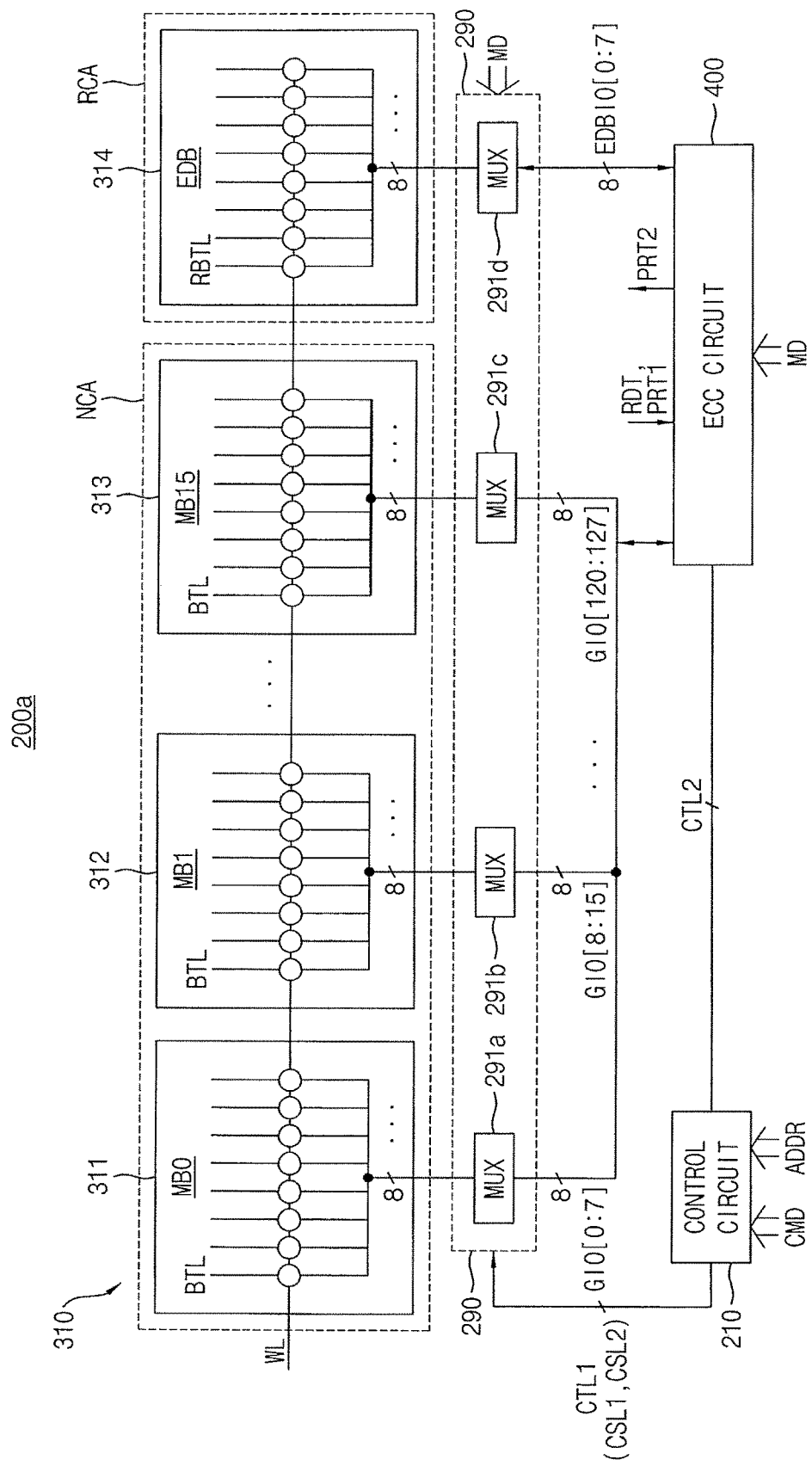
FIG. 10 illustrates a portion of the semiconductor memory device of FIG. 3 in a second normal write mode or in a masked write mode.
Figure 11:
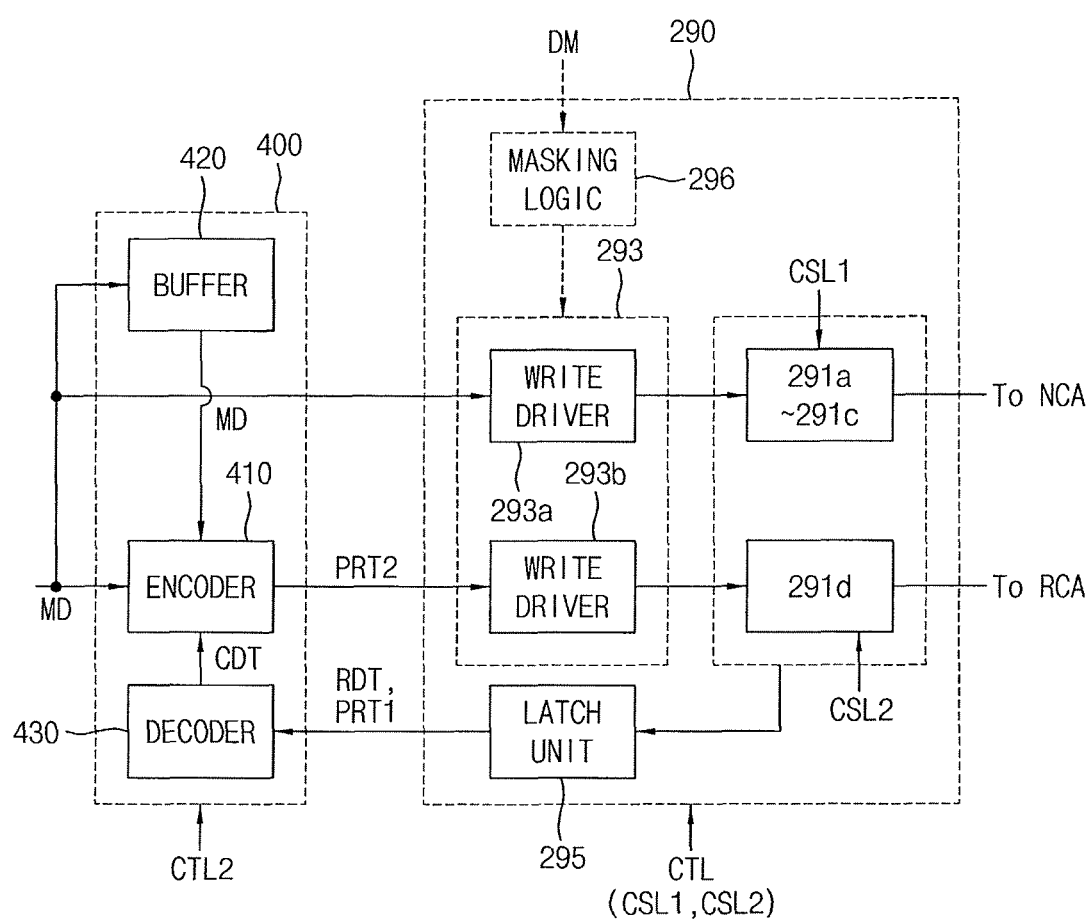
FIG. 11 illustrates the error correction circuit and the I/O gating circuit in FIG. 10.
Figure 12:
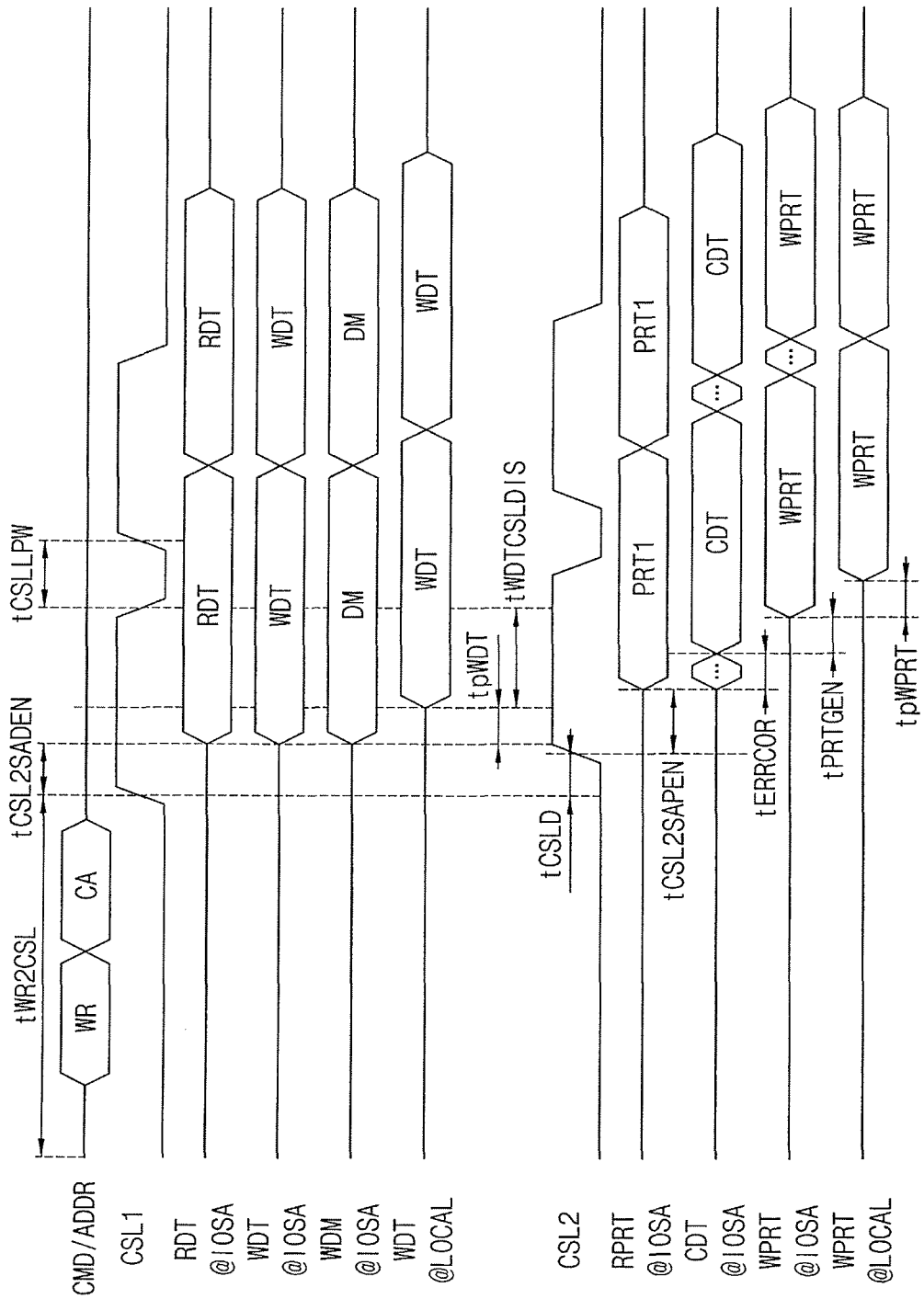
FIG. 12 illustrates an operation timing of the semiconductor memory device of FIG. 10 in the second normal write mode or the masked write mode.

FIG. 10 illustrates a portion of the semiconductor memory device of FIG. 3 in a second normal write mode or in a masked write mode, FIG. 11 illustrates the error correction circuit and the I/O gating circuit in FIG. 10 and FIG. 12 illustrates an operation timing of the semiconductor memory device of FIG. 10 in the second normal write mode or the masked write mode.

Referring to FIGS. 3 and 10 through 12, in the second write mode when a size of the main data MD is smaller than a size of the error correction unit or in the masked write mode, the semiconductor memory device 200a receives the command WR and the address CA from the memory controller 100, and the control logic circuit 210 activates the first column selection signal CSL1 when a time tWR2CSL elapses from a time at which the control logic circuit 210 receives the command CMD. When a time tCSL2SADEN elapses from a time at which the first column selection signal CSL1 is activated, a sense amplifier coupled to the first memory region is enabled and a first data RDT stored in the first region of the target page is provided to the decoder 430 through the I/O gating circuit 290. Simultaneously, the data I/O buffer 299 provides the write data WDT to the error correction circuit 400 and the I/O gating circuit 290 and the data I/O buffer 299 provides the data mask signal DM to the I/O gating circuit 290.

The first write driver 293a and the first switching circuits 291a~291c provide the write data WDT to the sense amplifier when the time tCSL2SADEN elapses from the time at which the first column selection signal CSL1 is activated. The write data WDT is transferred to memory cells of the target page when the time tpWDT elapses from the time at which the write data WDT is transferred to the sense amplifier.

The second column selection signal CSL2 is activated when the time tCSLD elapses from the time at which the first column selection CSL1 is activated. The encoder 410 generates the parity data WPRT during the time tPRTGEN when the time tCSL2SAPEN elapses from the time at which the second column selection signal CSL2 is activated first. A first parity PRT1 is read from the first region of the target page and the first parity data PRT1 is provided to the decoder 430 when a time tCSL2SAPEN elapses from the time at which the second column selection signal CSL2 is activated. The decoder 430 corrects an error bit of the first data RDT using the first parity data PRT1 and provides the corrected first data CDT to the encoder 410 during a time tERRCOR which starts from a time at which the decoder 430 receives the first parity data PRT1.

The encoder 410 generates a second parity data PRT2 based on the write data WDT stored in the buffer 420 and the corrected first data during a time tPRTGEN from a time at which the encoder 410 receives the corrected first data, and provides the second parity data PRT2 to the I/O gating circuit 290. The second write driver 293b and the second switching circuit 291d transfers the second parity data PRT2 to the sense amplifier after the second parity data PRT2 is generated.

The second parity data PRT2 is transferred to the memory cells in the second region of the target page when a time tpWPRT elapses from a time at which the second parity data PRT2 is transferred to the sense amplifier.

The I/O gating circuit 290 may further include a masking logic 296 to prevent a portion of the main data MD from being written to the target page. For example, the remaining main data of the main data MD unmasked by the masking logic 296 may be written to the target page so that a size of the main data MD written to the target is smaller than an error correction data unit that the error correction circuit 400 may operate at a time. In this case, the error correction data unit may include the remaining main data of the main data MD and a corrected data of the data RDT read from the target page.

Referring back to FIG. 11, a first data path may include the first write driver 293a and the first switching circuits 291a-291c, and a second data path may include a second write driver 2931 and a second switching circuit 291d. For example, the first data path is used for writing the main data MD to the target page, and the second data path is used for writing the parity data to the target page. The first data path and the second data path may be controlled by the column selection signals CSL1 and CSL2, respectively.

Figure 13:
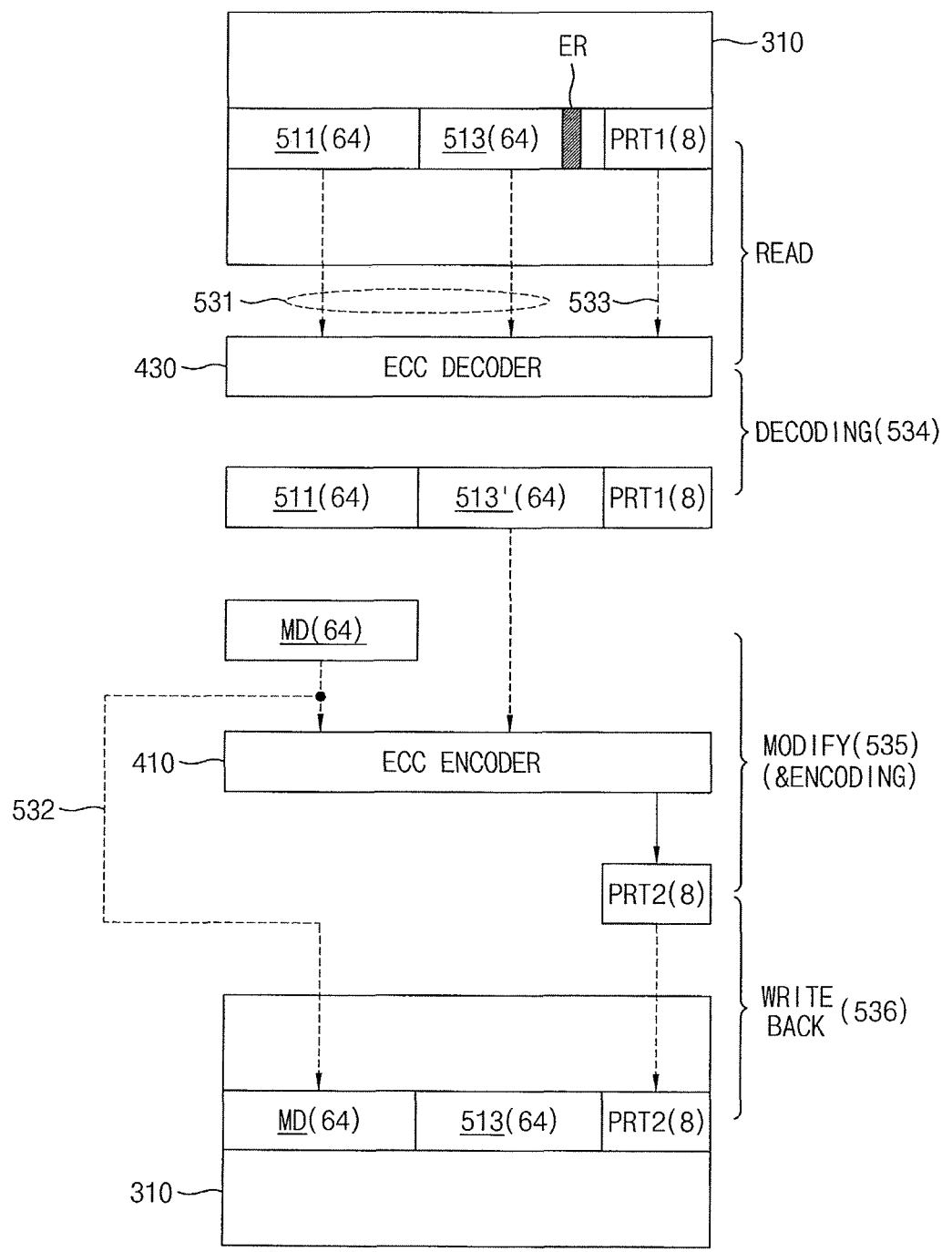
FIG. 13 illustrates that a write operation is performed in the semiconductor memory device of FIG. 10 in the second normal write mode and the masked write mode.

FIG. 13 illustrates that a write operation is performed in the semiconductor memory device of FIG. 10 in the second normal write mode or the masked write mode.

Referring to FIGS. 10 through 13, when the command CMD directs the masked write operation, or the size of the main data is smaller than the size of the error correction unit, a 64-bit first sub unit of data 511 and a 64-bit second sub unit of data 513 are read from the target page in the first bank array 310 and the first sub unit of data 511 and the second sub unit of data 513 are provided to the ECC decoder 430 as a reference numeral indicates 531. The 64-bit main data MD is written in a corresponding region of the target page through the first write driver 293a as a reference numeral 532 indicates.

The first parity data PRT1 is read from the second region of the target page and the first parity data PRT1 is provided to the decoder 430 as a reference numeral 533 indicates. The decoder 430 corrects an error bit of the second sub unit of data 513 as a reference numeral indicates 534 and provides the corrected second sub unit of data 513' to the encoder 410. The encoder performs an ECC encoding on the main data MD and the corrected second sub unit of data 513' to generate a second parity data PRT2 as a reference numeral 535 indicates. The encoder 410 provides the second parity data PRT2 to the I/O gating circuit 290 and the second write driver 293b writes the second parity data PRT2 in the second region of the target page as a reference numeral indicates 536.

In FIG. 13, data to be written in a memory location corresponding to the second sub unit of data 513 in the main data MD may be masked by the data mask signal DM.

Figure 14:
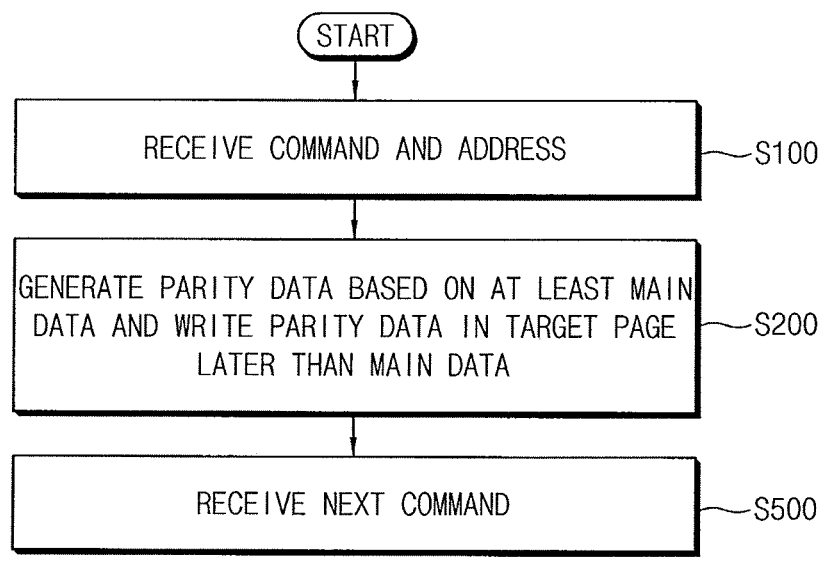
FIG. 14 is a flowchart illustrating a method of operating a semiconductor memory device according to an exemplary embodiment of the present inventive concept.

FIG. 14 is a flowchart illustrating a method of operating a semiconductor memory device according to example embodiments.

Referring to FIGS. 2 through 14, in a method of operating a semiconductor memory device 200a including a memory cell array 300 and an error correction circuit 400, the semiconductor memory device 200a receives the command CMD and the address ADDR from the memory controller 100 (S100). When the command CMD directs a write operation, the semiconductor memory device 100a performs a write operation to write the main data MD and the parity data PRT to a target page designated by the address ADDR while the semiconductor memory device 100a writes the parity data PRT later than the main data MD (S200). The parity data PRT may be generated based on at least the main data MD. When the write operation is completed, the semiconductor memory device 200a receives a next command from the memory controller 100 and executes an operation corresponding to the next command (S500).

Figure 15:
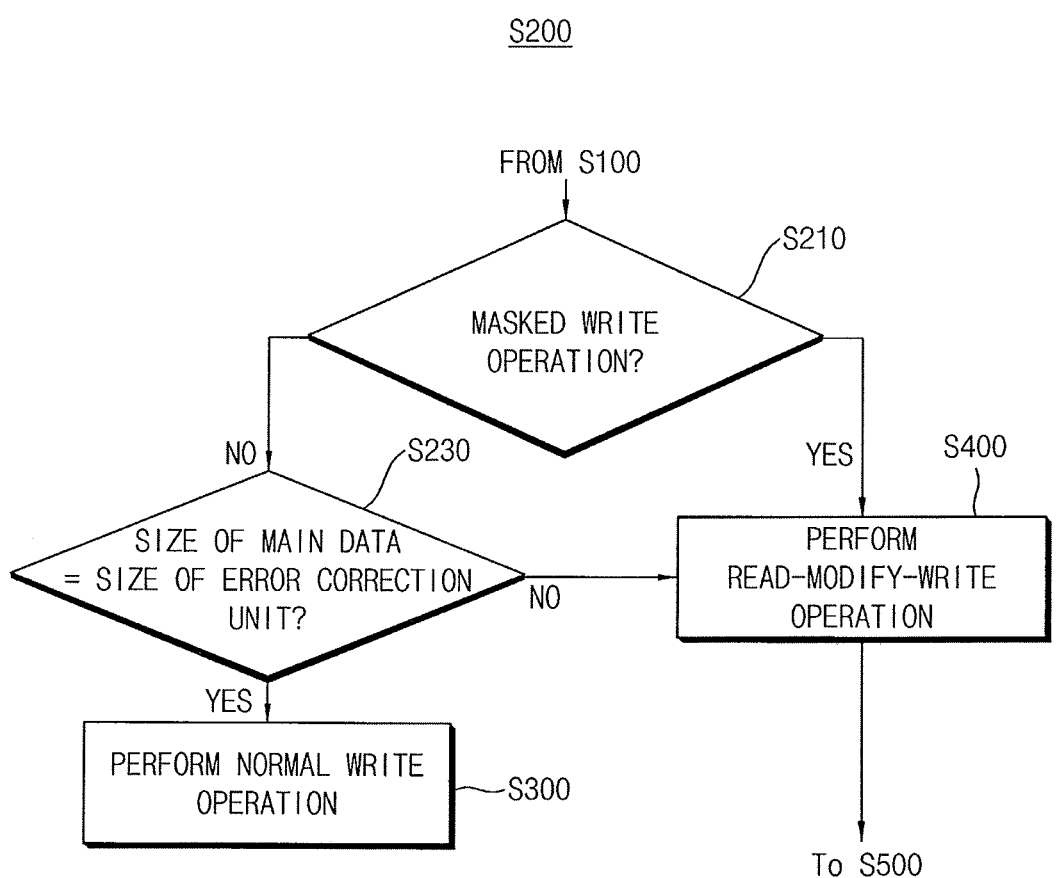
FIG. 15 illustrates that the write operation is performed in the method of FIG. 14.

FIG. 15 illustrates that the write operation is performed in the method of FIG. 14.

Referring to FIGS. 2 through 15, for performing the write operation (S200), the control logic circuit 210 determines whether the command CMD directs a masked write operation (S210). When the command CMD directs a normal write operation (NO in S210), a size of the main data MD is equal to a size of the error correction unit of the error correction circuit 400 (S230).

When the size of the main data MD is equal to the size of the error correction unit of the error correction circuit 400 (YES in S230), the control logic circuit 210 control the error correction circuit 400 and I/O gating circuit 290 to perform a normal write operation in which the parity data PRT is generated based on the main data MD (S300).

When the command CMD directs the masked write operation (YES in S210), or when the size of the main data MD is smaller the size of the error correction unit of the error correction circuit 400 (NO in S230), the control logic circuit 210 control the error correction circuit 400 and I/O gating circuit 290 to perform a read-modify-write operation in which the parity data PRT is generated based on the main data MD and a first data stored already in the target page (S400).

Figure 16:
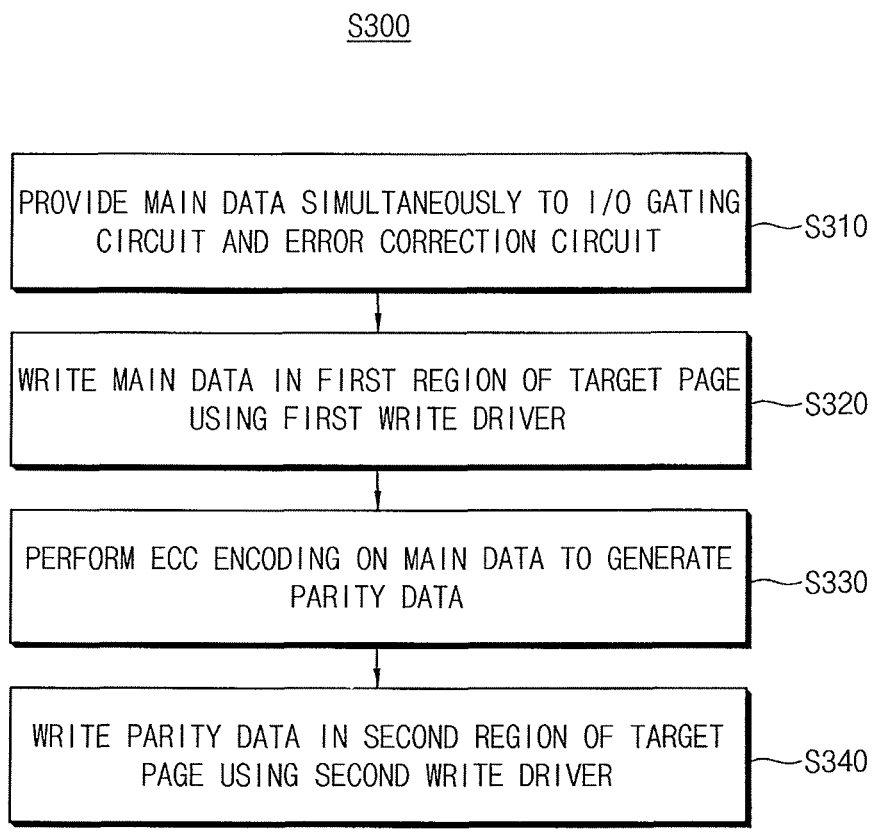
FIG. 16 illustrates that a normal write operation is performed in the method of FIG. 15.

FIG. 16 illustrates that a normal write operation is performed in the method of FIG. 15.

Referring to FIGS. 2 through 16, in the normal write operation (S300), the data I/O buffer 299 provides the main data MD simultaneously to the error correction circuit 400 and the I/O gating circuit 290 (S310). The first write driver 293a writes the main data MD to the first region of the target page through the first switching circuits 291a~291c (S320).

The ECC encoder 410 performs on an ECC encoding on the main data MD to generate the parity data PRT (S330). The second write driver 293b writes the parity data PRT to the second region of the target page through the second switching circuit 291d (S340). The control logic circuit 210 may activate the first column selection signal CSL1 in the first control signal earlier than the second column selection signal CSL2. The column selection signal CSL1 may be applied to the first switching circuits 291a~291c which connect an output of the first write driver 293a to the first region of the target page and the second column selection signal CSL2 may be applied to the second switching circuit 291d which connects an output of the second write driver 293b to the second region of the target page.

Figure 17:
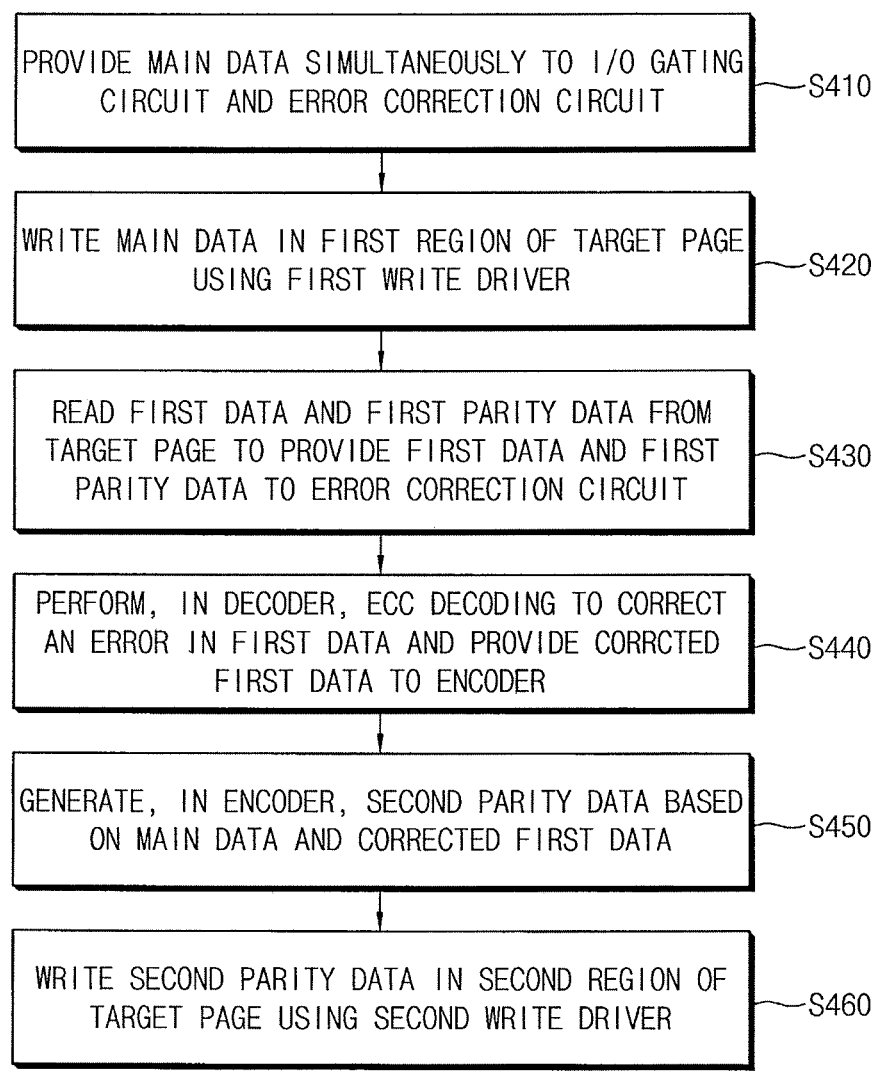
FIG. 17 illustrates that a read-modify-write operation is performed in the method of FIG. 15.

FIG. 17 illustrates that a read-modify-write operation is performed in the method of FIG. 15.

Referring to FIGS. 2 through 15 and 17, in the read-modify-write operation (S400), the sense amplifier 290 reads a first data from the first region of the target page while the data I/O buffer 299 provides the main data MD simultaneously to the error correction circuit 400 and the I/O gating circuit 290 (S410). The sense amplifier provides the first data to the I/O gating circuit 290. The write driver 293a writes the main data MD to the first region of the target page through the first switching circuits 291a~291c while the latch unit 295 reads the first data from the first region of the target page (S420). The first data is provided to the error correction circuit 400.

A first parity data is read from the second region of the target page later than the first data is read from the first region of the target page and the first parity data is provided to the error correction circuit 400 (S430). The ECC decoder 430 performs an ECC decoding on the first data based on the first parity data to correct an error bit of the first data and provides the corrected first data to the ECC encoder 410 (S440).

The ECC encoder 410 performs an ECC encoding on the main data MD and a portion of the corrected first data based on the main data MD and the corrected first data to generate a second parity data (S450). The portion of the corrected first data corresponds to data stored in a memory region designated by the data mask signal DM, data that is already stored in a memory region in the first region of the target page, in which the main data MD is not to be stored, or the corrected data.

The second write driver 293b writes the second parity data to the second region of the target page through the second switching circuit 291d (S460).

Figure 18:
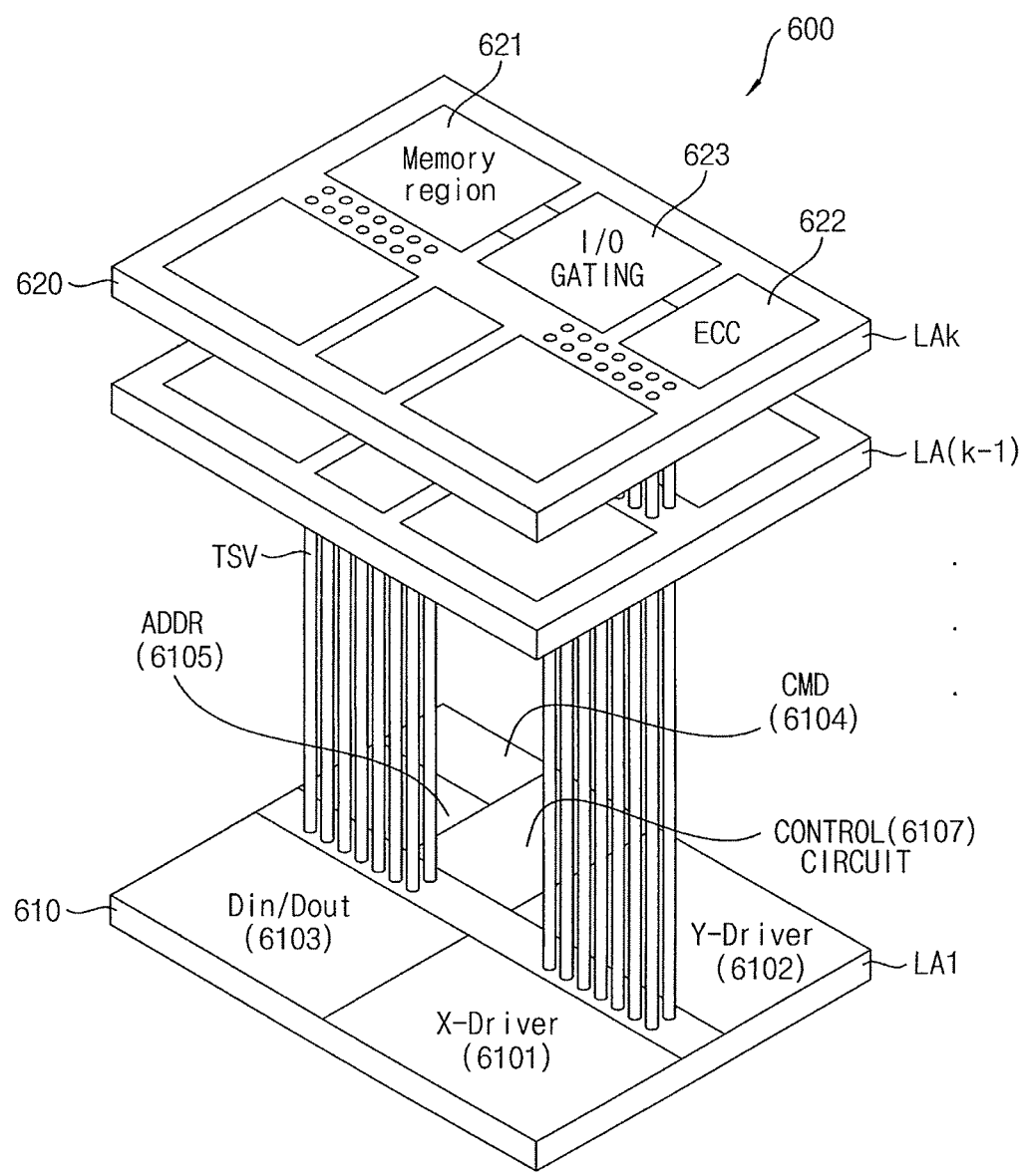
FIG. 18 is a structural diagram illustrating a semiconductor memory device according to an exemplary embodiment of the present inventive concept.

FIG. 18 is a structural diagram illustrating a semiconductor memory device according to example embodiments.

Referring to FIG. 18, a semiconductor memory device 600 may include first through kth semiconductor integrated circuit layers LA1 through LAk (k is an integer equal to or greater than three), in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAk or 620 as the slave chip.

The first semiconductor integrated circuit layer 610 may include various peripheral circuits for driving memory region 621 provided in the kth semiconductor integrated circuit layer 620. For example, the first semiconductor integrated circuit layer 610 may include a row (X)-driver 6101 for driving word lines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of bank arrays in which a plurality of memory cells are arranged as described with reference to FIGS. 3, 7 and 10.

The first semiconductor integrated circuit layer 610 may further include a control logic circuit (or also referred to as a control logic) 6107. The control logic circuit 6107 may access the memory region 621 and may generate control signals for accessing the memory region 621 based on the command from the memory controller.

The kth semiconductor integrated circuit layer 620 may include an error correction circuit 622 that performs an ECC encoding on data to be stored in the memory region 621 and performs an ECC decoding on data read from the memory region 621. The kth semiconductor integrated circuit layer 620 may further include an I/O gating circuit 623 that connects the memory region 612 with the error correction circuit 622. When a command from an external device such as the memory controller 100 is a write command, the control logic circuit 6107 controls the error correction circuit 622 to generate parity data based on at least a main data from the external device and to control the I/O gating circuit 623 to write the parity data to a target page of the memory region 621 later than the main data. Therefore, the semiconductor memory device 200a may reduce prevent an increase of a core cycle time because the semiconductor memory device 600 may hide a time required to generate the parity to an outside of the semiconductor memory device 600.

Figure 19:
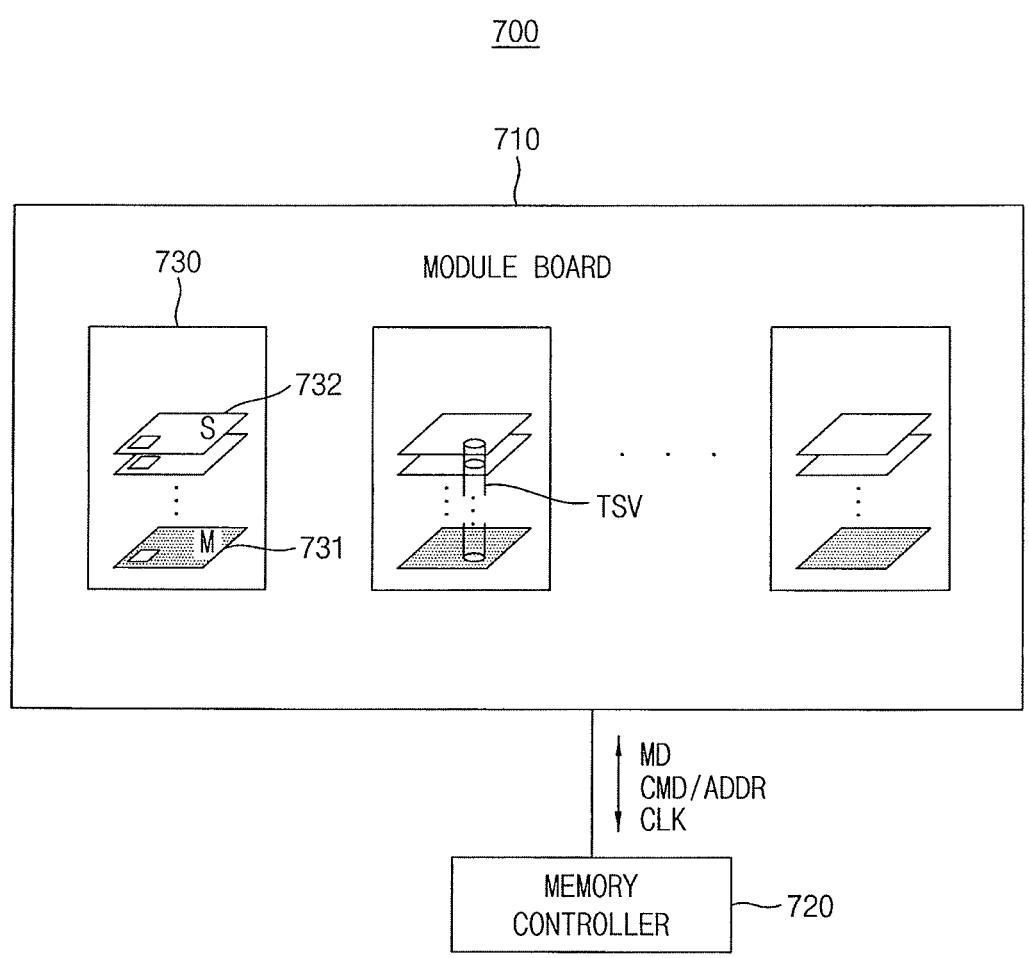
FIG. 19 illustrates a memory system including the semiconductor memory device according to an exemplary embodiment of the present inventive concept.

FIG. 19 illustrates a memory system including the semiconductor memory device according to example embodiments.

Referring to FIG. 19, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 3. For example, the semiconductor memory device 730 may be constructed as a DRAM chip or a MRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200a of FIG. 3. Therefore, each of the master chip 731 and the slave chip 732 may include a memory cell array, an error correction circuit and I/O gating circuit that connects the memory cell array with the error correction circuit as described with reference to FIGS. 2 through 17. When a command from the memory controller 720 is a write command, the control logic circuit controls the error correction circuit to generate parity data based on at least a main data from the memory controller 720 and to control the I/O gating circuit to write the parity data to a target page of the memory cell array later than the main data. Therefore, each of the master chip 731 and the slave chip 732 may reduce prevent an increase of a core cycle time because each of the master chip 731 and the slave chip 732 may hide a time required to generate the parity to an outside of the master chip 731 and the slave chip 732.

In addition, in embodiments of the present inventive concept, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648, which are hereby incorporated by reference in their entirety.

The memory module 710 may communicate with the memory controller 720 via a system bus. Main data MD, a command/address CMD/ADDR, and a clock signal CLK may be transmitted and received between the memory module 710 and the memory controller 720 via the system bus.

Figure 20:
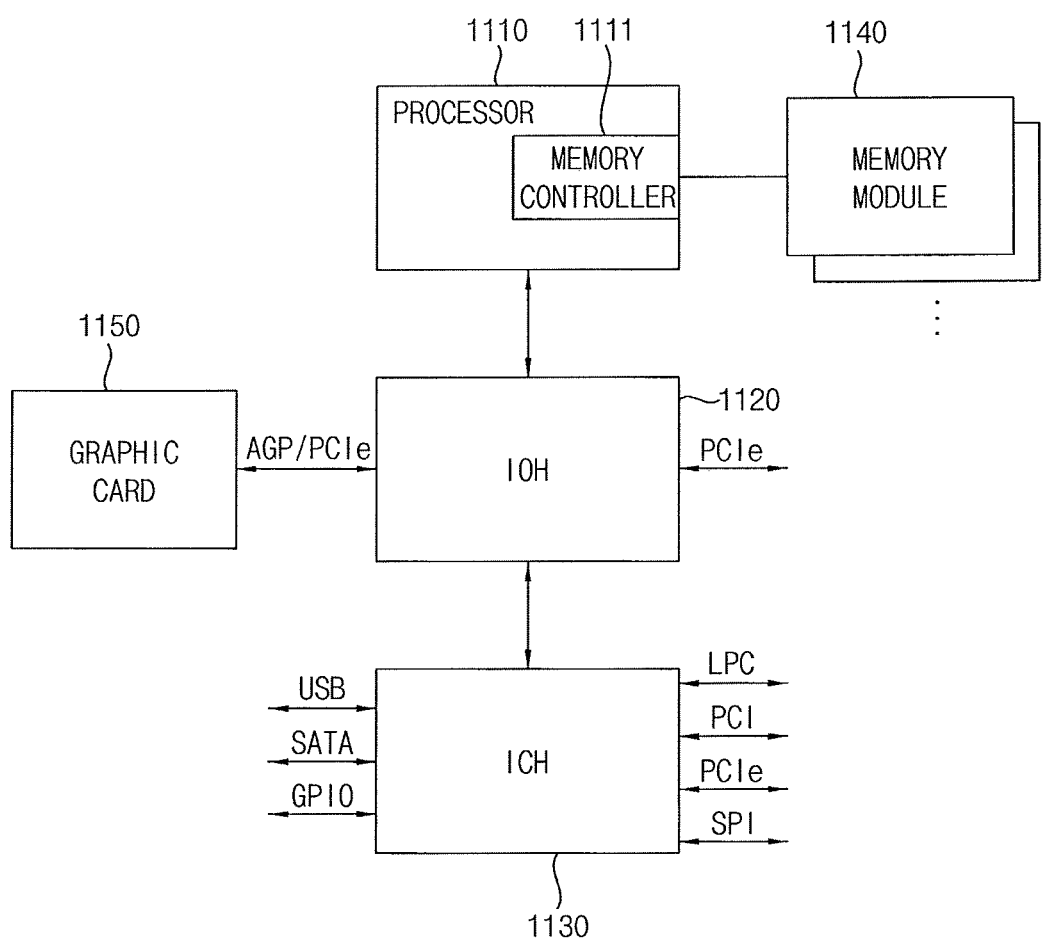
FIG. 20 is a block diagram illustrating a computing system including the semiconductor memory device according to an exemplary embodiment of the present inventive concept.

FIG. 20 is a block diagram illustrating a computing system including the semiconductor memory device according to example embodiments.

Referring to FIG. 20, a computing system 1100 may include a processor 1110, an input/output hub (IOH) 1120, an input/output controller hub (ICH) 1130, at least one memory module 1140 and a graphics card 1150. In an exemplary embodiment, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In an exemplary embodiment, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, In an exemplary embodiment, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In an exemplary embodiment, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device 200a of FIG. 3. Therefore, each of the plurality of semiconductor memory devices may include a memory cell array, an error correction circuit and I/O gating circuit that connects the memory cell array with the error correction circuit as described with reference to FIGS. 2 through 17. When a command from the memory controller 1111 is a write command, the control logic circuit controls the error correction circuit to generate parity data based on at least a main data from the memory controller 1111 and to control the I/O gating circuit to write the parity data to a target page of the memory cell array later than the main data. Therefore, each of the semiconductor memory devices may reduce prevent an increase of a core cycle time because each of semiconductor memory devices may hide a time required to generate the parity to an outside of the semiconductor memory devices.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a Quick-Path interconnect (QPI), a common system interface (CSI), etc. Although FIG. 20 illustrates the computing system 1100 including one input/output hub 1120, in an exemplary embodiment, the computing system 1100 may include a plurality of input/output hubs.

The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In an exemplary embodiment, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In an exemplary embodiment, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

Aspects of the present inventive concept may be applied to systems using semiconductor memory devices. For example aspects of the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or other such electronic devices.

The parity data, as described above throughout the specification, may be referenced as at least one parity bit. The parity data may includes a single parity bit or two or more parity bits.

In an exemplary embodiment, the error correction circuit 400 of FIGS. 3, 7 and 10 may receive an error correction data unit and generate at least one parity bit based on the error correction data unit. In the first normal write mode of FIG. 9 for example, the error correction data unit may include the main data MD received from the memory controller and the at least one parity bit may be generated based on the main data. In the second normal write mode of FIG. 12 for example, the error correction data unit may include the main data MD and the corrected data of data RDT read from the target page, and the at least one parity bit may be generated based on the main data and the corrected data.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. A method of operating a semiconductor memory device including a memory cell array and an error correction circuit, the method comprising:
   receiving a write command, main data and an address from a memory controller;
   providing an error correction data unit to the error correction circuit, wherein the error correction data unit includes the main data;
   determining whether a size of the main data is the same as a size of the error correction data unit;
   generating at least one parity bit based on the error correction data unit; and
   performing, in response to the write command, a write operation on a target page selected by the address so that the at least one parity bit and the main data are written to the target page and the at least one parity bit is written later than the main data to the target page.

2. The method of claim 1,
   wherein the performing of the write operation, if the size of the main data is same as a the size of the error correction data unit, comprises:
   providing the main data simultaneously to the error correction circuit and an input/output (I/O) gating circuit connected to the memory cell array;
   writing the main data to a first region of the target page by using a first write driver of the I/O gating circuit;
   performing an error correction code (ECC) encoding on the main data to generate the at least one parity bit by using the error correction circuit; and
   writing the at least one parity bit to a second region of the target page by using a second write driver of the I/O gating circuit.

3. The method of claim 1,
   wherein the main data is written to the target page in response to a first column selection signal,
   wherein the at least one parity bit is written to the target page in response to a second column selection signal, and
   wherein the second column selection signal is activated a predetermined time after the first column selection signal is activated.

4. The method of claim 1,
   wherein if the size of the main data is smaller than the size of the error correction data unit, the error correction data unit further includes corrected data of data read from the target page.

5. The method of claim 4,
   wherein the generating of the at least one parity bit comprises:
   reading a first data from a first region of the target page to provide the first data to the error correction circuit;
   providing the main data to the error correction circuit and an input/output (I/O) gating circuit connected to the memory cell array;
   writing the main data to the first region of the target page by using a first write driver of the I/O gating circuit;
   reading at least one first parity bit from a second region of the target page to provide the at least one first parity bit to the error correction circuit;
   correcting an error bit of the first data in a decoder of the error correction circuit to provide a corrected first data to an encoder of the error correction circuit; and
   generating, in the encoder, the at least one parity bit based on the main data and the corrected first data,
   wherein the reading of the first data and the providing of the main data are performed in parallel.

6. The method of claim 1,
   wherein if a portion of the main data is masked, the error correction data unit includes a remaining portion of the main data and corrected data of data read from the target page.

7. The method of claim 6,
   wherein the generating of the at least one parity bit comprises:
   reading a first data from a first region of the target page to provide the first data to the error correction circuit;
   providing the main data to the error correction circuit and an input/output (I/O) gating circuit connected to the memory cell array;
   writing the remaining portion of the main data to the first region of the target page by using a first write driver of the I/O gating circuit;

reading at least one first parity bit from a second region of the target page to provide the at least one first parity bit to the error correction circuit;

correcting an error bit of the first data in a decoder of the error correction circuit to provide a corrected first data to an encoder of the error correction circuit; and generating, in the encoder, the at least one parity bit based on the remaining portion of the main data and the corrected first data, wherein the reading of the first data and the providing of the main data are performed in parallel.

8. The method of claim 7, wherein the remaining portion of the main data is written to the target page in response to a first column selection signal, wherein the at least one parity bit is written to the target page in response to a second column selection signal, and wherein the second column selection signal is activated a predetermined time after the first column selection signal is activated.

9. The method of claim 1, wherein the memory cell array includes a plurality of bank arrays and each of the bank arrays includes a plurality of dynamic memory cells or a plurality of resistive type memory cells.

10. A semiconductor memory device comprising:

a memory cell array including a plurality of bank arrays;

an input/output (I/O) gating circuit connected to the memory cell array;

a control logic circuit configured to decode a command received from a memory controller to generate a plurality of control signals; and an error correction circuit connected to the I/O gating circuit and configured to correct an error correction data unit, wherein the control logic circuit is configured to receive the command, a main data and an address from the memory controller, to determine whether a size of the main data is the same as a size of the error correction data unit, to control the error correction circuit to generate at least one parity bit based on the error correction data unit including the main data and to control the I/O gating circuit to write the at least one parity bit to a target page of the memory cell array later than the main data.

11. The semiconductor memory device of claim 10, wherein the I/O gating circuit comprises:

first switching circuits connected to a first region of the target page;

a second switching circuit connected to a second region of the target page;

a first write driver connected to the first switching circuits; and a second write driver connected to the second switching circuit.

12. The semiconductor memory device of claim 11, wherein if the size of the main data is equal to the size of the error correction data unit of the error correction circuit, the control logic circuit is configured to control the I/O gating circuit to write the main data to the first region through the first write driver and the first switching circuits and to write the at least one parity bit to the second region through the second write driver and the second switching circuit, an encoder of the error correction circuit is configured to generate the at least one parity bit based on the main data, the control logic circuit is configured to activate a second column selection signal later than a first column selection signal, the first column selection signal is applied to the first switching circuits and the second column selection signal is applied to the second switching circuit.

13. The semiconductor memory device of claim 11, wherein if a size of the main data is smaller than a size of an error correction data unit of the error correction circuit or if the command directs a masked write operation, the error correction data unit further includes corrected data of data read from the target page, and wherein the error correction circuit receives data read from the target page and generates the corrected data.

14. The semiconductor memory device of claim 10, wherein the memory cell array includes a three-dimensional memory cell array and each of the plurality of bank arrays includes a plurality of dynamic memory cells or a plurality of resistive type memory cells.

15. A method of operating a semiconductor memory device including a memory cell array and an error correction circuit, the method comprising:

receiving main data and an address;

generating at least one parity bit from an error correction data unit including the main data;

writing the main data through a first data path to a page of the memory cell array; and writing the at least one parity bit through a second data path to the page, wherein the page is selected by the address, wherein the writing of the at least one parity bit and the writing of the main data are performed in parallel, and wherein the writing of the at least one parity bit starts a predetermined time after the writing of the main data starts.

16. The method of claim 15, further comprising:

generating a plurality of control signals including a first control signal and a second control signal; and controlling the first data path using the first control signal;

controlling the second data path using the second control signal;

wherein the second control signal is activated the predetermined time after the first control signal is activated.

17. The method of claim 15, further comprising:

determining whether a size of the error correction data unit is greater than a size of the main data; and wherein if the size of the error correction data unit is determined to be equal to the size of the main data, the at least one parity bit is generated based on the main data.

18. The method of claim 15, further comprising:

determining whether a size of the error correction data unit is greater than a size of the main data; and wherein if the size of the error correction data unit is determined to be greater than the size of the main data, the error correction data unit further includes corrected data read from the page, and the at least one parity bit is generated from the main data and the corrected data.

\* \* \* \* \*